United States Patent [19]

Rogers

[11] Patent Number: 5,087,841

[45] Date of Patent: Feb. 11, 1992

[54] TTL TO CMOS TRANSLATING CIRCUITS WITHOUT STATIC CURRENT

[75] Inventor: Alan C. Rogers, South Portland, Me.

[73] Assignee: National Semiconductor Corporation, Santa Clara, Calif.

[21] Appl. No.: 508,283

[22] Filed: Apr. 9, 1990

[51] Int. Cl.[5] ................ H03K 19/092; H03K 19/094; H03K 19/003; H03K 19/017

[52] U.S. Cl. .................................. 307/475; 307/446; 307/451; 307/443; 307/263; 307/542; 307/544

[58] Field of Search ............... 307/475, 443, 451, 448, 307/263, 585, 473, 270, 542, 544, 446

[56] References Cited

U.S. PATENT DOCUMENTS

| | | | |
|---|---|---|---|
| 4,258,272 | 3/1981 | Huang | 307/475 |
| 4,314,166 | 2/1982 | Bismarck | 307/475 |
| 4,380,710 | 4/1983 | Cohen et al. | 307/475 |
| 4,437,024 | 3/1984 | Wacyk | 307/594 X |
| 4,501,978 | 2/1985 | Gentile et al. | 307/475 |
| 4,677,321 | 6/1987 | Bacrania | 307/475 |
| 4,786,830 | 11/1988 | Foss | 307/475 |
| 4,801,824 | 1/1989 | Fellinger et al. | 307/475 X |
| 4,916,337 | 4/1990 | Leung et al. | 307/475 |
| 4,988,897 | 1/1991 | Jeong | 307/279 X |

Primary Examiner—Edward P. Westin
Assistant Examiner—David R. Bertelson
Attorney, Agent, or Firm—James W. Rose; Daniel H. Kane

[57] ABSTRACT

TTL to CMOS level translating buffer circuits incorporate multiple stages with feedback and forward couplings between stages that eliminate static current $I_{cct}$ when TTL high potential level data signal is applied at the buffer circuit input. The feedback and feed forward couplings maintain and enhance signal propagation speed in the buffer circuits at the same time. TTL to CMOS translating latch circuits and flip-flop circuits similarly incorporate feedback and feed forward circuit couplings to save and retain data signals during latch mode, static mode, and tristate mode operation while at the same time substantially eliminating static high current $I_{cct}$. The clock circuit portions for the latch and flip-flop circuits also are arranged in clock circuit configurations that are free of static current $I_{cct}$.

40 Claims, 5 Drawing Sheets

FIG 3

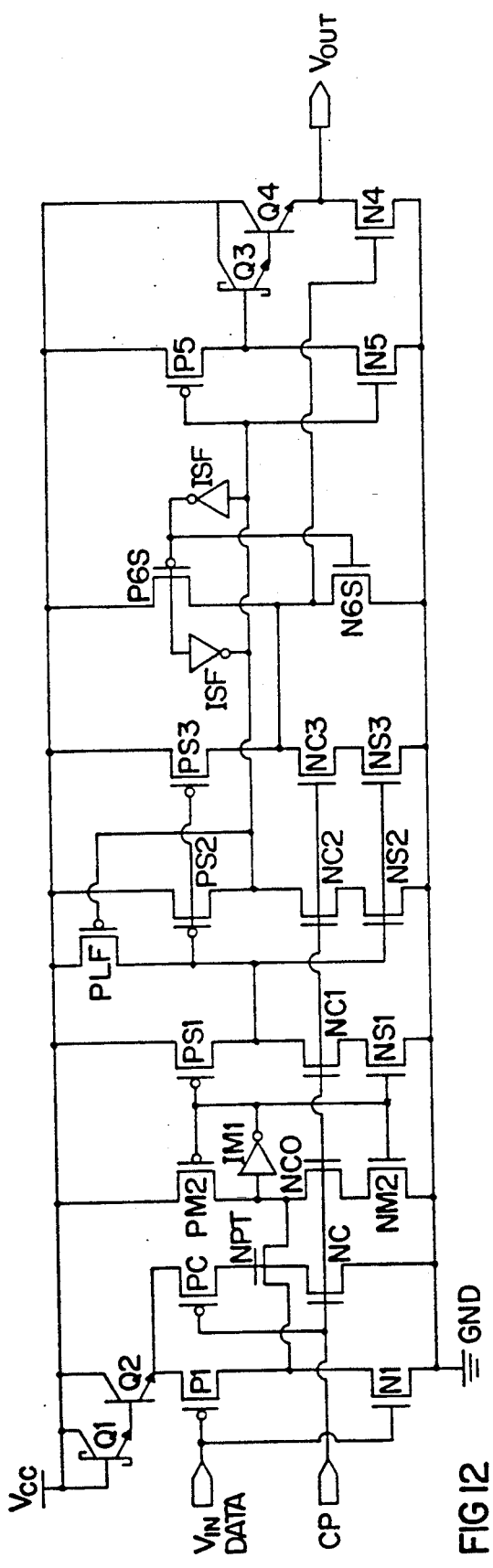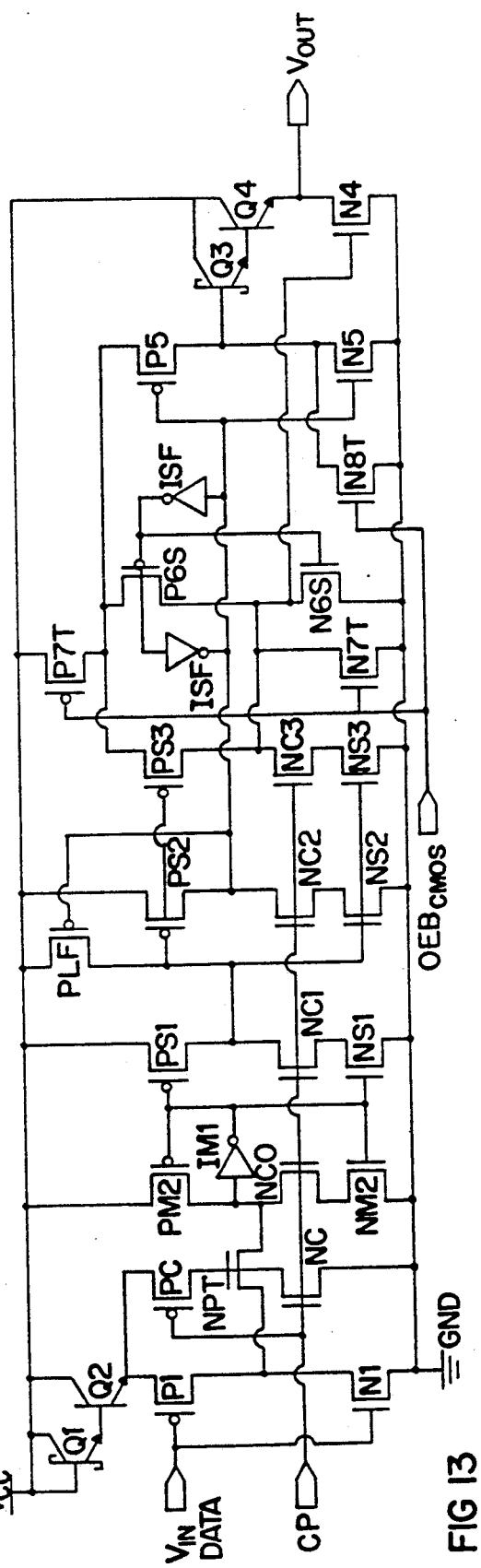
FIG 12
FIG 13

TTL TO CMOS TRANSLATING CIRCUITS WITHOUT STATIC CURRENT

TECHNICAL FIELD

This invention relates to CMOS circuits which are coupled to input data signal thresholds other than the normal CMOS rail-to-rail voltage levels. Typically the CMOS circuits are sensitive to input data signal levels generated by TTL devices and circuits. Thus the invention provides TTL to CMOS data signal potential level translating circuits. In particular the specification sets forth TTL to CMOS translating buffer circuits, latch circuits, flip-flop circuits, etc. which operate without substantial quiescent or static current when a TTL high potential level data signal is applied at the input.

BACKGROUND ART

A prior art CMOS buffer circuit is illustrated in FIG. 1 with a TTL input node $V_{IN}$ receiving input data signals of TTL high and low potential levels and at least one CMOS output node $V_{OUT}$ delivering output data signals at CMOS high and low potential levels. The CMOS buffer circuit incorporates multiple invertor stages coupled between the high potential rail $V_{CC}$ and the low potential rail GND. Each stage includes a pullup transistor element coupled to the high potential rail $V_{CC}$, and a pulldown transistor element coupled to the low potential rail GND, an input node, and an output node.

For example, the first stage is composed of pullup transistor element P1 and pulldown transistor element N1 providing a data input stage. The fourth stage is composed of pullup transistor element P4 and pulldown transistor element N4 and provides a data output stage. In this example each of the pullup transistor elements P1, P2, P3 and P4 is a PMOS transistor element, while each of the pulldown transistor elements N1, N2, N3 and N4 is an NMOS transistor element.

The CMOS rail voltages are typically GND 0v and $V_{CC}$ 5v. The TTL high and low potential levels of input data signals applied at the TTL input node $V_{IN}$ however may only be in the range of for example 0v and 3v. In the worst case, the TTL data input signal swing may be even less. The initial stages of the buffer circuit must therefore change or translate the TTL input signal voltage swing to the full CMOS rail-to-rail signal voltage swing.

A problem encountered in the TTL to CMOS translation is that the non-rail TTL high potential level applied at the TTL input node $V_{IN}$ is typically insufficient to turn off the PMOS pullup transistor element P1. The PMOS transistor element begins conducting with a threshold voltage across the source to gate junction greater than for example 1v. With a $V_{CC}$ rail of 5v and a TTL high potential level in the range of 2 to 3 volts applied at the TTL input node, PMOS pullup transistor element P1 remains conducting. This unwanted power supply current during the static high TTL data signal potential level at the input is referred to as the leakage current, quiescent current, static high current, or simply static current $I_{CCt}$.

In order to avoid the static high current, one prior art solution is to introduce one or more voltage drop threshold components in series with the PMOS pullup transistor element between the pullup transistor element and the high potential rail. For example, a stack of three diodes might be coupled between transistor element P1 and $V_{CC}$. With PN junction diodes the rail potential at the source of PMOS transistor element P1 is therefore reduced from 5v to approximately 3v. With a TTL high potential level applied at the TTL input node, the source to gate voltage threshold across transistor element P1 is reduced to substantially zero along with the static high current $I_{CCt}$.

With a TTL low potential level applied at the TTL input node however, pullup transistor element P1 can no longer pullup the output node of the first stage to the high potential rail. Voltage drop threshold components must therefore be coupled in series with the pullup transistor element P2 of the second stage in order to avoid static current through the second stage. For example a stack of two diodes might be coupled in series between PMOS pullup transistor element P2 and the high potential rail $V_{CC}$. A further voltage drop threshold component may be necessary in the third stage for example a single diode coupled between PMOS pullup transistor element P3 and the $V_{CC}$ rail.

Successive stages thus boost the data signal high potential level from the TTL high voltage level to the full CMOS high potential rail voltage of, for example 5v. Level translation is achieved while eliminating static current $I_{CCt}$ at each stage. However, the successive threshold components increase propagation delay of data signals through the buffer circuit.

In order to maintain switching speed and limit propagation delay during AC performance, a specified level of static high current $I_{CCt}$ is normally tolerated in DC performance. This is accomplished without using threshold components. Instead, the size of the PMOS pullup transistor elements in initial stages is substantially reduced in order to reduce in turn the $I_{CCt}$. In pure CMOS circuits the PMOS pullup transistor element is normally substantially larger than the corresponding NMOS pulldown transistor element because of the greater conductivity of NMOS transistor elements. In contrast, at the first stage or data input stage of the buffer circuit of FIG. 1, pullup transistor element P1 is for example a 25u channel width PMOS transistor element while the pulldown transistor element N1 is a 100u channel width NMOS transistor element. At stage 2 transistor elements P2 and N2 are PMOS and NMOS transistor elements with equal 125u channel widths. By the third stage the respective sizes of the pullup and pulldown transistor elements return to a more standard ratio with a 500u channel width PMOS transistor element P3 and a 250u channel width NMOS transistor element N3. The output node from the third stage P3, N3 drives the final large pullup and pulldown transistor elements of the data output stage, a 1600u channel width PMOS transistor element P4 and a 1000u channel width NMOS transistor element N4. By the output of the third stage however the TTL high and low potential level signals have been translated to the full CMOS high and low potential levels, 0v and 5v, the voltages of the high and low potential rails. This is accomplished while maintaining AC performance signal propagation speed but with a static current $I_{CCt}$ specification of 1.5mA. The problem of simultaneously reducing or eliminating $I_{CCt}$ while maintaining switching speed has yet to be solved in the prior art.

Objects of the Invention

It is therefore an object of the present invention to provide new CMOS circuits responsive to TTL high and low potential level input data signals. The CMOS circuits substantially eliminate static high current $I_{CCt}$ while maintaining desired signal propagation speed through the circuit. Thus the CMOS circuits of the invention provide substantially zero $I_{CCt}$ DC performance and high speed AC performance.

Another object of the invention is to provide TTL to CMOS translating circuits incorporating feedback transistor elements, and feedback and feed forward circuit couplings, for eliminating static current $I_{CCt}$ while maintaining high speed switching characteristics.

A further object of the invention is to provide new TTL to CMOS translating circuits applicable for example in buffer circuits, latch circuits and flip-flop circuits. The invention incorporates a variety of features in the circuits for eliminating $I_{CCt}$, maintaining speed, and data saving with data retention in the latch mode and in the tristate mode of various circuit configurations.

The invention also provides TTL to CMOS translating latch circuits and flip-flop circuits with TTL clock input signals in which $I_{CCt}$ is also eliminated in the clock circuit portions and clock circuit components. In the latch circuit and flip-flop circuit embodiments of the invention, the feedback transistor elements and feedback couplings assure data integrity and data retention in the latch mode while avoiding the static current.

Disclosure of the Invention

In order to accomplish these results the invention provides a buffer circuit having a first stage and a second stage, the output node of the first stage being coupled with the input node of the second stage at an intermediate node. The first and second stages each have a PMOS pullup transistor element and an NMOS pulldown transistor element. In order to eliminate static high current $I_{CCt}$ in the first stage, a voltage drop threshold circuit is coupled between the PMOS pullup transistor element of the first stage and the high potential rail. The threshold component circuit interposes sufficient voltage drop for turning off the first stage PMOS pullup transistor element with a TTL high potential level signal at the respective first stage input node.

According to the invention a feedback pullup transistor element is coupled between the intermediate node and the high potential rail. The second stage output node is coupled to drive the feedback pullup transistor element in a feedback coupling for pullup of the intermediate node to the CMOS high potential level for turn off of the second stage PMOS pullup transistor element. A feature of this circuit arrangement of the invention is that the buffer circuit exhibits no substantial static current $I_{CCt}$ through the first and second stages. At the same time the propagation delay caused by incorporating threshold component elements in successive stages is avoided by limiting the threshold component circuit to the first stage.

The feedback pullup transistor element is typically a PMOS transistor element with source and drain nodes coupled between the high potential rail and the intermediate node. The output node of the second stage is coupled in a feedback coupling to the control gate node. The threshold component may be an NMOS transistor element coupled in a diode configuration between the first stage pullup transistor element and the high potential rail. Bipolar transistor elements coupled in a diode configuration and in a diode stack are also useful for the threshold component circuit.

In the preferred example embodiment, the TTL to CMOS translating buffer circuit incorporates first, second and third stages each having a PMOS pullup transistor element and an NMOS pulldown transistor element. A voltage drop threshold component circuit is coupled between the PMOS pullup transistor element of the first stage and the high potential rail for eliminating static current $I_{CCt}$ in the first stage. The output node of the first stage is coupled to drive the second stage NMOS pulldown transistor element. The output node of the second stage is coupled to drive the third stage PMOS pullup transistor element. The output node of the third stage is coupled in a feedback coupling to drive the second stage pullup transistor element.

As a result the control gate node of the second stage pullup transistor element is pulled to the CMOS high potential level for turning off the second stage pullup transistor element and eliminating $I_{CCt}$ in the second stage. The output node of the second stage can therefore also be pulled up to the CMOS high potential level for turning off the third stage PMOS pullup transistor element. An advantage of the preferred three stage circuit arrangement of the buffer circuit is that there is substantially no static current $I_{CCt}$ through either of the first, second or third stages.

In order to enhance the speed of signal propagation in the three stage buffer circuit, the input node of the first stage is coupled to drive both the first stage and third stage pulldown transistor elements in a feed forward coupling. Because the first and third stages are in phase, the signal propagation delay can thereby be reduced.

In order to minimize crowbar current in the third stage caused by accelerating first turn off of the third stage pulldown transistor element in the first feed forward coupling, the turn off of the third stage PMOS pullup transistor element is also accelerated by a second feed forward coupling. To accomplish this result the third stage incorporates first and second PMOS pullup transistor elements coupled in series. The output node of the second stage is coupled to drive the third stage first pullup transistor element. The input node of the first stage is also coupled to drive the third stage second pullup transistor element in a second feed forward coupling. As a result, crowbar current from simultaneous conduction by both the pullup and pulldown transistor elements in the third stage is substantially reduced, and the size of the third stage transistor elements may be increased.

In describing the invention, it is noted that the transistor elements are generally MOS transistor elements with a primary current path between source and drain nodes, and a control gate node. It is the control gate node that is "driven" by the source and drain nodes of other transistor elements and stages.

In order to provide a low impedance threshold component circuit at the source of the first stage PMOS pullup transistor element, the invention also provides a low impedance transient current source circuit. A capacitor is coupled to the source node of the first stage PMOS pullup transistor element for providing transient current upon turn on of the pullup transistor element. A charging feedback transistor element is coupled to the capacitor for recharging the capacitor.

The invention also contemplates providing an output stage for the buffer circuit. In the preferred examples, the invention provides split path output stages for symmetrical control of low to high (LH) and high to low (HL) transitions at the final output node. To accomplish this a fourth stage is coupled in parallel with the third stage with similar PMOS first and second pullup transistor elements coupled in series and an NMOS pulldown transistor element. The output nodes of the respective parallel third and fourth stages provide first and second split path nodes for driving split path output stages. To this end the output stage is constructed with first and second split path output stages, each with pullup and pulldown transistor elements.

The first split path output stage has an input node coupled to the first split path node from the third stage. An output node of the first split path output stage is coupled to drive the second split path output stage pullup transistor element. The second split path node of the fourth stage is coupled to drive the second split path output stage pulldown transistor element. Finally the second split path output stage has an output node which provides the buffer circuit final CMOS output node. The second split path output stage pullup and pulldown transistor elements provide the final CMOS output node pullup and pulldown transistor elements. These are separately controlled by the split path nodes with independent split path drive control of the final output node pullup and pulldown transistor elements. The independent split path drive control permits sizing of transistors for symmetrical or equal LH and HL transitions.

A tristate enable signal input node and tristate enable transistor elements may also be coupled into the buffer circuit for disabling the final CMOS output node pullup and pulldown transistor elements in response to a tristate enable signal. The CMOS output node pullup transistor element of the final stage may be for example a pair of bipolar transistor elements in a Darlington configuration, or an NMOS pullup transistor element. When using NMOS transistor elements for both the pullup and pulldown transistor elements in the final stage, the first and second split path nodes and the first and second split path output stages provide phase splitting for controlling the NMOS pullup and pulldown transistor elements in opposite phases.

The invention also provides latch circuits and flip-flop circuits with data saving and data retention in addition to substantially eliminating static high current $I_{CC_t}$. The basic latch circuit according to the invention is composed of divided latch stages including a first latch stage having an input node coupled to the latch circuit TTL input node. The divided latch stages also include a second latch stage having an input node coupled to the first latch stage output node at an intermediate node. The latch circuit also includes at least one output stage having an output node providing the latch circuit CMOS output node. An output node of the second latch stage is coupled to drive the output stage.

According to one basic configuration, a first NMOS clock transistor element is coupled in series with the first latch stage pulldown transistor element. A second NMOS clock transistor element is coupled in series with the second latch stage pulldown transistor element. A single phase TTL clock pulse node with clock pulse signals at TTL high and low potential levels is coupled to drive the first and second clock transistor elements. The circuit arrangement is a feed forward parallel coupling which clocks the divided latch stages at the same time with a single phase clock signal while the divided latch stages contain two phases of data. The clock transistor elements do not include PMOS transistor elements and therefore have no substantial static current $I_{CC_t}$ in the latch mode. The split latch stages with NMOS clock transistor elements and single phase clock signals is suitable for dynamic mode latch circuit operation.

According to another basic configuration a data retention latch feedback transistor element (PLF) is coupled between the intermediate node and the high potential rail. The output node of the second latch stage is coupled to drive the PLF for retaining data signals in the latch mode for static mode operation of the latch circuit.

The basic latch circuit further includes an output stage and a pair of static feedback cross coupled invertors operatively coupled between the output node of the second latch stage and the input node of the output stage for further retention of data signals at the output during static mode operation of the latch circuit.

The divided latch stages incorporate PMOS pullup transistor elements. A threshold component element or circuit is coupled between the PMOS pullup transistor element of the split first latch stage and the high potential rail. The threshold component circuit interposes sufficient voltage drop for turning off the first latch stage PMOS pullup transistor element with a TTL high potential level signal at the respective first latch stage input node. The data retention feedback transistor element pulls up the intermediate node to the CMOS high potential level for turning off the PMOS transistor element of the second latch stage. An advantage of this split latch circuit arrangement of the invention is that there is no substantial static current $I_{CC_t}$ through either the split first or second latch stages.

In the TTL to CMOS translating flip-flop circuit according to the invention, the divided latch stages described above are the first slave stage and second slave stage of a split slave latch. The data retention slave latch feedback transistor element coupled between the intermediate node and high potential rail assures retention and saving of two phases of data signals in the split slave latch during the latch mode and during static mode operation of the flip-flop circuit. The NMOS clock transistor elements as described above permit simultaneous clocking of the first and second slave stages without $I_{CC_t}$ in the clock portions of the circuit.

A master latch having master latch cross coupled invertor stages is coupled at an output node of the master latch to the input node of the first slave stage. A pass through gate is coupled to an input node of the master latch. A data input stage is operatively coupled between the pass through gate and the flip-flop circuit TTL input node. A clock input gate is coupled between the single phase TTL clock pulse node and the pass through gate for controlling operation of the pass through gate out of phase with the NMOS clock transistor elements of the split or divided first and second slave stages.

According to the invention the data input stage and clock input stage have PMOS pullup transistor elements coupled to a common node. A voltage drop threshold component circuit is coupled between this common node and the high potential rail. This threshold component circuit interposes sufficient voltage drop for turning off the data input stage PMOS pullup transistor element with a TTL high potential level signal at the flip-flop circuit TTL data input node. It also assures turn off of the clock input stage PMOS pullup transistor element with a TTL high potential level signal at the single phase TTL clock input node.

In the preferred example embodiment the pass through gate is an NMOS transistor element having a control gate node coupled to an output node of the clock input stage. The pass through gate NMOS transistor element source and drain nodes are coupled between an output node of the data input stage and an input node of the master latch. The NMOS transistor element therefore achieves full transition from TTL high and low potential levels at the flip-flop circuit TTL input node to the full CMOS signal voltage swing between the high and low potential rail voltages at the input node of the master latch. The flip-flop circuit configuration therefore has no substantial static current $I_{CCt}$ through the respective stages of the flip-flop circuit.

A third slave stage can be coupled in parallel with the second slave stage to provide first and second split path nodes for driving split path output stages. Furthermore the flip-flop circuit output stage may include first and second split path output stages as heretofore described. The first and second split path nodes and first and second split path output stages provide independent drive control of the final CMOS output node pullup and pulldown transistor elements and phase splitting for control of the final CMOS output node pullup and pulldown transistor elements in opposite phases. The independent drive control of the final pullup and pulldown transistor elements permits sizing of the transistors to achieve symmetrical LH and HL transitions at the output.

A tristate enable input node and tristate enable transistor elements may also be incorporated in the flip-flop circuit for implementing a tristate mode. Novel circuit arrangements include a third data retention stage coupled in the static feedback cross coupled invertor stages for saving data at the final output node in the tristate mode of operation for restoring data upon power up from the tristate and in particular during ZL transitions.

Other objects, features and advantages of the invention are apparent in the following specification and accompanying drawings.

BRIEF DESCRIPTION OF THE DRAWINGS

FIG. 12 is another schematic circuit diagram of the flip-flop circuit with additional circuit features for split path control of the output and for independent control of the final CMOS output node pullup and pulldown transistor elements.

FIG. 13 is another schematic circuit diagram of the flip-flop circuit with yet additional circuit features for incorporating tristate enable components in the flip-flop circuit.

DESCRIPTION OF PREFERRED EXAMPLE EMBODIMENTS AND BEST MODE OF THE INVENTION

Figure 1:
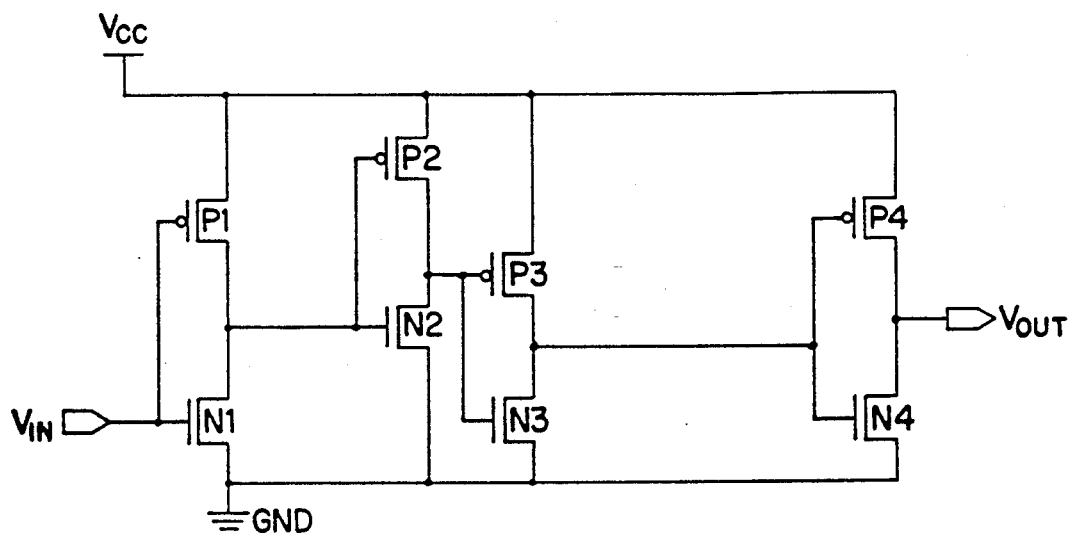
FIG. 1 is a schematic circuit diagram of a prior art four stage TTL to CMOS output buffer circuit.
Figure 2:
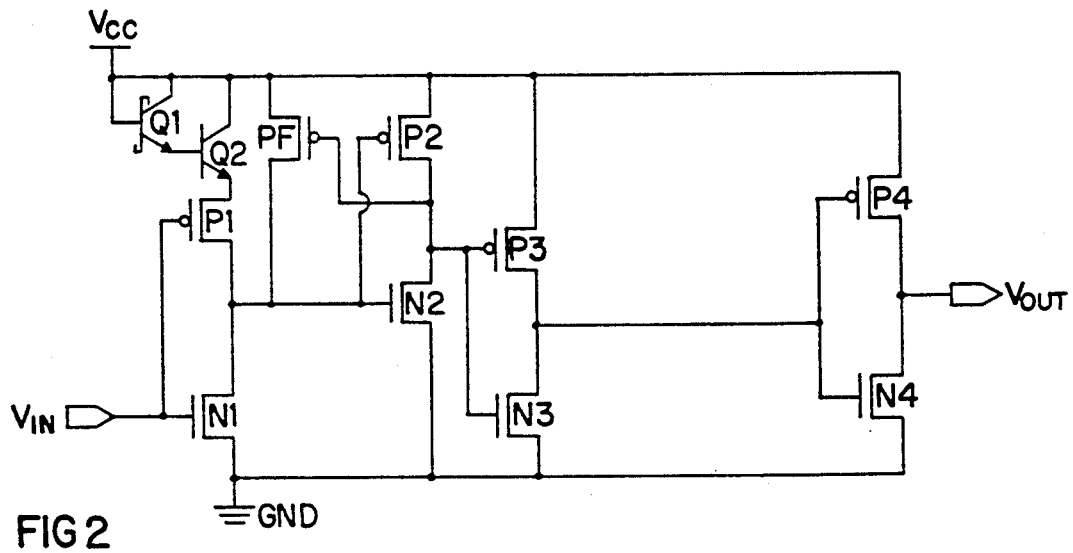
FIG. 2 is a schematic circuit diagram of a four stage TTL to CMOS level translating buffer circuit according to the invention substantially eliminating static current $I_{CCt}$.

A basic TTL to CMOS translating buffer circuit according to the invention is illustrated in FIG. 2. The circuit of FIG. 2 illustrates the four stages of the buffer circuit of FIG. 1 however the circuit portions of the invention are accomplished in the first two stages. In order to eliminate static current $I_{CCt}$ in the first stage, a threshold component circuit is interposed between the source node of PMOS pullup transistor element P1 and the high potential rail $V_{CC}$. In this example two bipolar transistor elements Q1 and Q2 are coupled in diode configuration forming a stack of two PN junction diodes. The bipolar diode coupled transistor elements Q1, Q2 used for the threshold components provide the advantage of tracking the TTL circuit or TTL device coupled to the TTL input node of the buffer circuit.

In order to eliminate static current $I_{CCt}$ through the second stage without sacrificing switching speed, a PMOS feedback transistor element PF is coupled between the output node of the first stage and the high potential rail $V_{CC}$. The output node of the first stage coincides with the input node of the second stage at an intermediate node. The drain terminal of the PMOS feedback transistor element PF is coupled to the intermediate node while the source terminal is coupled to the high potential rail. The output node of the second stage P2, N2 is coupled to the control gate node of PF to drive the feedback transistor element in the proper phase. Feedback transistor element PF can therefore pullup the intermediate node for CMOS high potential level and turn off the PMOS pullup transistor element P2 of the second stage. The objectives of the invention are thus accomplished in the first two stages while the third and fourth stages remain the same as in FIG. 1.

Example channel widths for the transistor elements of the circuit of FIG. 2 are set forth in Table I. It is noted that the PMOS feedback transistor element PF is a relatively small transistor element of for example 20μ channel width. This is sufficient to perform the "boot strap" operation of pulling up the intermediate node to the CMOS high potential level of the high potential rail $V_{CC}$.

TABLE I
(FIG. 2)

| MOS TRANSISTOR | CHANNEL WIDTH (μ) |
|---|---|
| P1 | 400 |
| N1 | 200 |
| PF | 20 |
| P2 | 125 |
| N2 | 125 |
| P3 | 500 |
| N3 | 250 |
| P4 | 1600 |
| N4 | 1000 |

Figure 3:
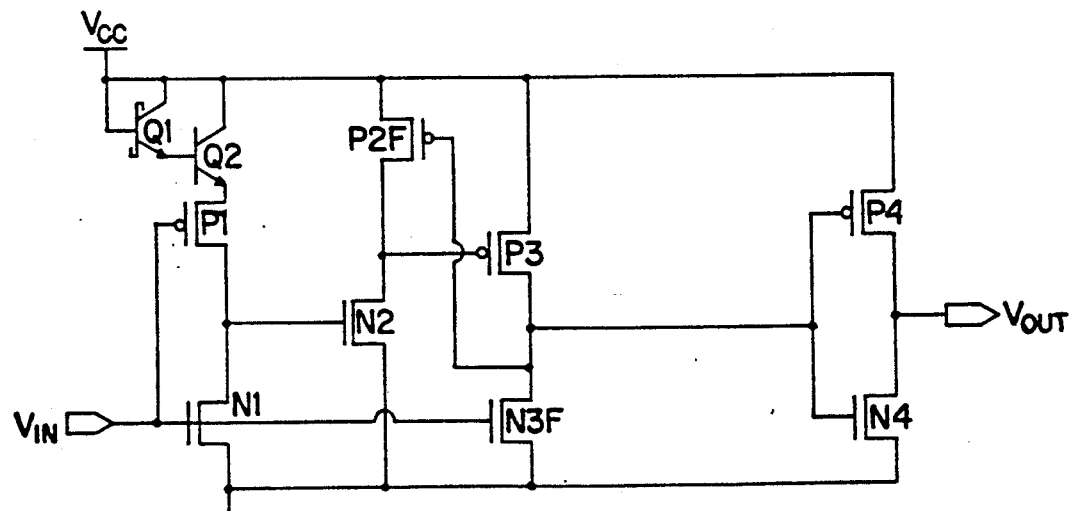
FIG. 3 is a schematic circuit diagram of a preferred example embodiment of the TTL to CMOS translating buffer circuit with increased AC performance speed but without substantial static current DC performance.

In the preferred circuit embodiment, the objectives of the invention are achieved in three stages as illustrated in the TTL to CMOS translating buffer circuit of FIG. 3. In this preferred circuit arrangement, the output node of the first stage P1, N1 is coupled to drive only the NMOS pulldown transistor element N2 of the second stage P2F, N2. The output node of the second stage is coupled to drive only the PMOS pullup transistor element P3 of the third stage P3, N3F. The pullup transistor element P2F of the second stage is driven by the output node of the third stage P3, N3F. The analysis of static current $I_{CCt}$ in the circuit is as follows.

The threshold component diode coupled transistor elements Q1 and Q2 eliminate static current in the first stage. The PMOS pullup transistor element P2F of the second stage is not driven by the output node of the first stage but rather the output node of the third stage P3, N3F. The output node of the third stage P3, N3F applies the full CMOS high potential level rail voltage to the control gate of P2F. P2F therefore turns off completely eliminating static current in the second stage. Furthermore the feedback transistor element P2F is able to pull up the output node of the second stage to the high potential rail voltage level turning off the PMOS pullup transistor element P3 of the third stage and eliminating static current in the third stage. This circuit arrangement therefore results in substantially zero static current $I_{CCt}$ in all of the stages of the buffer circuit.

Switching speed is enhanced and data signal propagation delay is limited in the following respects. The first stage P1, N1 drives only half a stage, namely pulldown transistor element N2. The second stage P2F, N2 similarly drives only a half stage namely pullup transistor element P3. This split path arrangement reduces switching transition time for the respective stages effectively in half. As further shown in the circuit of FIG. 3, the input node of the first stage P1, N1 which provides the TTL input node $V_{IN}$ is coupled in a feed forward coupling to drive not only the first stage NMOS pulldown transistor element N1 but also the third stage pulldown transistor element N3F. The feed forward pulldown transistor element N3F is in phase with the first stage pulldown transistor element N1 and initiates pulldown at the output node of the third stage without the conventional signal propagation delay, further enhancing the overall switching speed of the buffer circuit.

Figure 4:
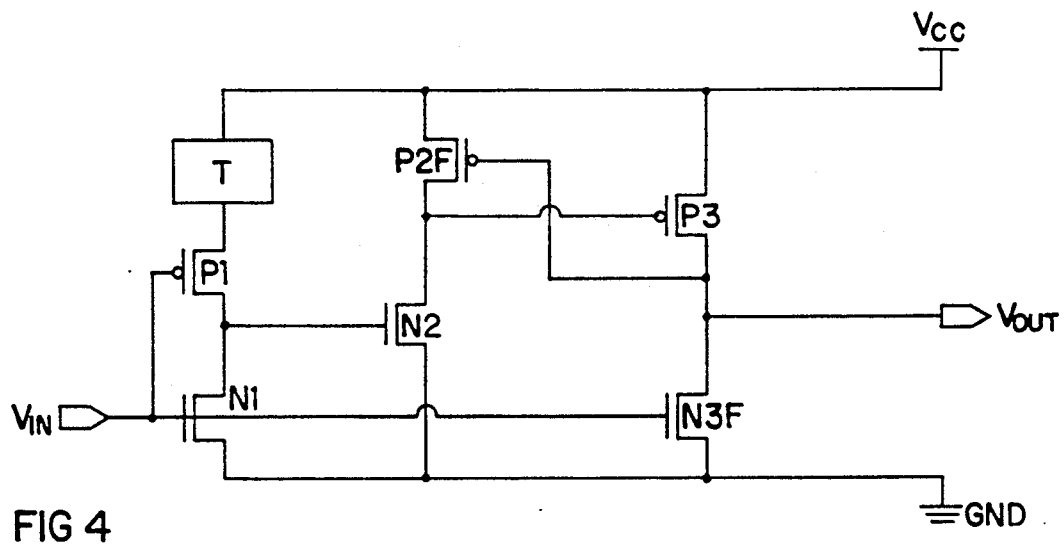
FIG. 4 is a schematic diagram of a generalized three stage TTL to CMOS level translating buffer circuit according to the invention.

In the preferred buffer circuit arrangement of FIG. 3 the objectives of substantially eliminating $I_{CCt}$ while maintaining or enhancing signal propagation speed are achieved in three stages while the fourth data stage remains the same as in FIGS. 1&2. MOS transistor element channel widths for the MOS transistor elements of the buffer circuit are set forth by way of example in Table II. The generalized three stage TTL to CMOS buffer circuit according to the invention is summarized in FIG. 4. The threshold component circuit T for the first stage is also shown in generalized form. The threshold component circuit may be provided by a stack of diodes, diode coupled bipolar transistor elements, an NMOS transistor element coupled in diode configuration, etc.

TABLE II
(FIG. 3)

| MOS TRANSISTOR | CHANNEL WIDTH (μ) |
|---|---|
| P1 | 400 |
| N1 | 40 |
| P2F | 20 |
| N2 | 125 |
| P3 | 600 |
| N3F | 1500 |
| P4 | 1600 |
| N4 | 1000 |

Figure 5:
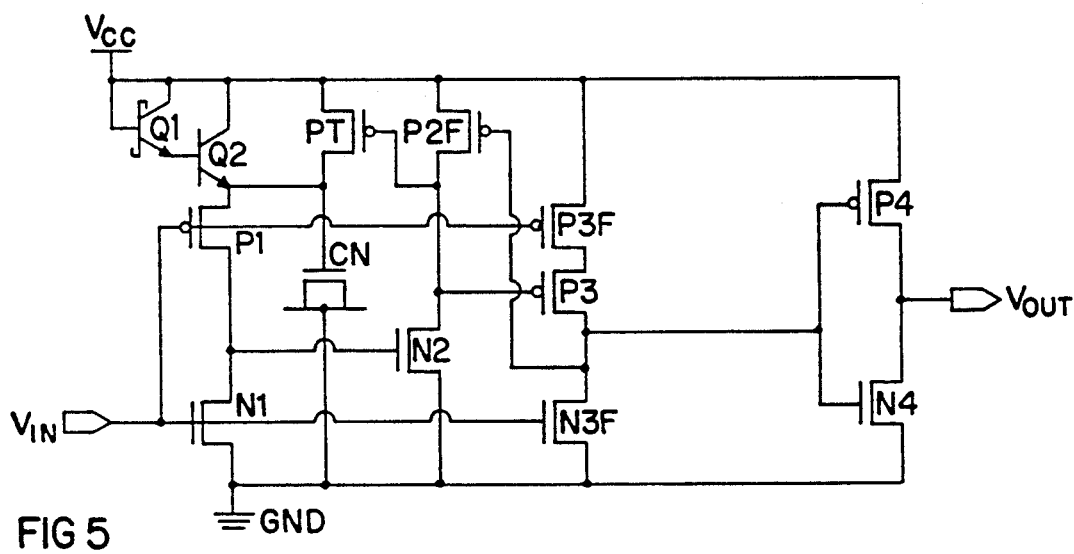
FIG. 5 is a schematic circuit diagram of the four stage buffer circuit similar to FIG. 3 with added circuit features for a low impedance voltage drop threshold component circuit and reduced crowbar current at the third stage.

Further improvements in the speed of operation are set forth in the buffer circuit of FIG. 5 in which the circuit components performing the same or similar function as the circuit components of FIG. 3 are indicated by the same reference numeral or reference designation. Two additional features of the invention are set forth in FIG. 5. First the pullup circuit for the third stage of the buffer circuit is provided by first and second pullup transistor elements P3 and P3F. As heretofore described, the output node of the second stage P2F, N2 is coupled to drive only the first PMOS transistor element P3 of the third stage. The second PMOS pullup transistor element P3F of the third stage is coupled in a feed forward coupling to the input node of the first stage. Thus the TTL input node $V_{IN}$ is coupled in a parallel feed forward coupling to the first stage PMOS pullup transistor element P1 and the third stage second PMOS pullup transistor element P3F. The third stage pullup transistor elements P3F and P3 are coupled in series. A high potential data signal at the input $V_{IN}$ can therefore initiate the process of turning off the pullup circuit of the third stage in phase with the pullup transistor element P1 of the first stage.

The advantage of this arrangement is that it reduces simultaneous conduction of the third stage pullup and pulldown transistor elements and resulting power consuming "crowbar" current. Because of the feed forward coupling from the input node $V_{IN}$ to the third stage pulldown transistor element N3F, turn on of the pulldown transistor element N3F is initiated without conventional propagation delay while the first pullup transistor element P3 of the third stage is still conducting. The feed forward coupling from the input node $V_{IN}$ to the second pullup transistor element P3F can therefore initiate turning off of the pullup circuit, enhancing speed while reducing power consumption.

A further improvement in switching speed is provided in the buffer circuit of FIG. 5 using an enhanced threshold component circuit. In the buffer circuit of FIG. 5 circuit components are added to provide a low impedance transient current source to enhance turn on of the first stage PMOS pullup transistor element P1. To this end a capacitor CN is coupled to the source node of P1. The capacitor CN is charged by a threshold feedback transistor element PT. Upon turn on of P1, capacitor CN provides a low Z transient current source to accelerate the turn on. Subsequently capacitor CN is recharged by transistor element PT. Example values for the sizes of the MOS transistor elements and components of the buffer circuit of FIG. 5 in terms of channel widths are set forth in Table III.

TABLE III

| (FIG. 5) | |
|---|---|
| MOS TRANSISTOR | CHANNEL WIDTH (μ) |
| P1 | 400 |
| N1 | 40 |
| PT | 20 |
| CN | 1000 |
| P2F | 20 |
| N2 | 125 |
| P3F | 800 |
| P3 | 800 |
| N3F | 1500 |
| P4 | 1600 |
| N4 | 1000 |

Figure 6:
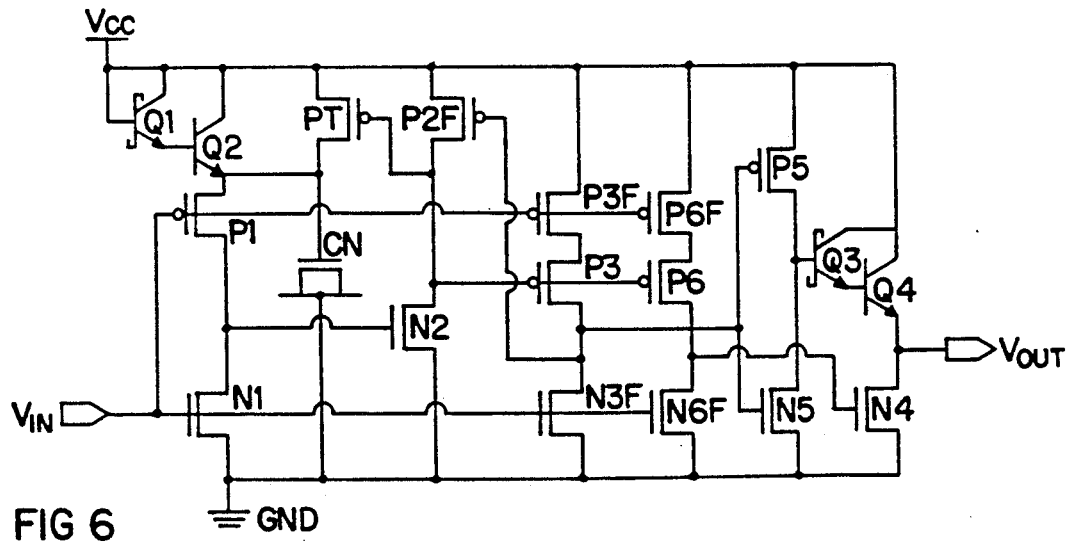
FIG. 6 is a schematic circuit diagram of the four stage buffer circuit of FIG. 5 with added circuit features for split path output control.

Another incremental improvement upon the four stage buffer circuit of FIG. 5 is set forth in the buffer circuit of FIG. 6 where provision is made for split path control at the final CMOS output node $V_{OUT}$. As shown in FIG. 6 the third stage is split into two parallel stages P3F, P3, N3F and P6F, P6, N6F. These split internal stages are coupled in parallel and provide internal first and second split path nodes for driving split path output stages.

The fourth stage providing the data output stage P4, N4 of FIG. 5 is itself divided into split path output stages P5, N5 and Q3, Q4, N4. The first split path node from internal stage P3F, P3, N3F is coupled to the input node of the first split path output stage P5, N5. The output node of this first split path output stage is coupled to drive the pullup transistor element Q3, Q4 of the second split path output stage. The second split path node of internal stage P6F, P6, N6F is coupled to drive the pulldown transistor element N4 of the second split path output stage. Independent split path drive control is therefore provided for the respective pullup transistor element Q3, Q4 and pulldown transistor element N4 which control the final CMOS output node $V_{OUT}$. As a result the LH and HL transitions at the output $V_{OUT}$ may be equalized. Exemplary values for the MOS transistor elements and components of the buffer circuit of FIG. 6 are set forth in Table IV. It is noted that a Darlington transistor pair Q3, Q4 is used for the final pullup transistor element at the second split path output stage, increasing compatibility and tracking with reference to related TTL devices.

TABLE IV

| (FIG. 6) | |
|---|---|
| MOS TRANSISTOR | CHANNEL WIDTH (μ) |
| P1 | 400 |
| N1 | 40 |
| PT | 20 |
| CN | 1000 |
| P2F | 20 |
| N2 | 125 |
| P3F | 270 |
| P3 | 270 |
| N3F | 500 |
| P6F | 540 |
| P6 | 540 |
| N6F | 1000 |
| P5 | 300 |
| N5 | 75 |

TABLE IV-continued

| (FIG. 6) | |
|---|---|
| MOS TRANSISTOR | CHANNEL WIDTH (μ) |
| N4 | 1000 |

Figure 7:
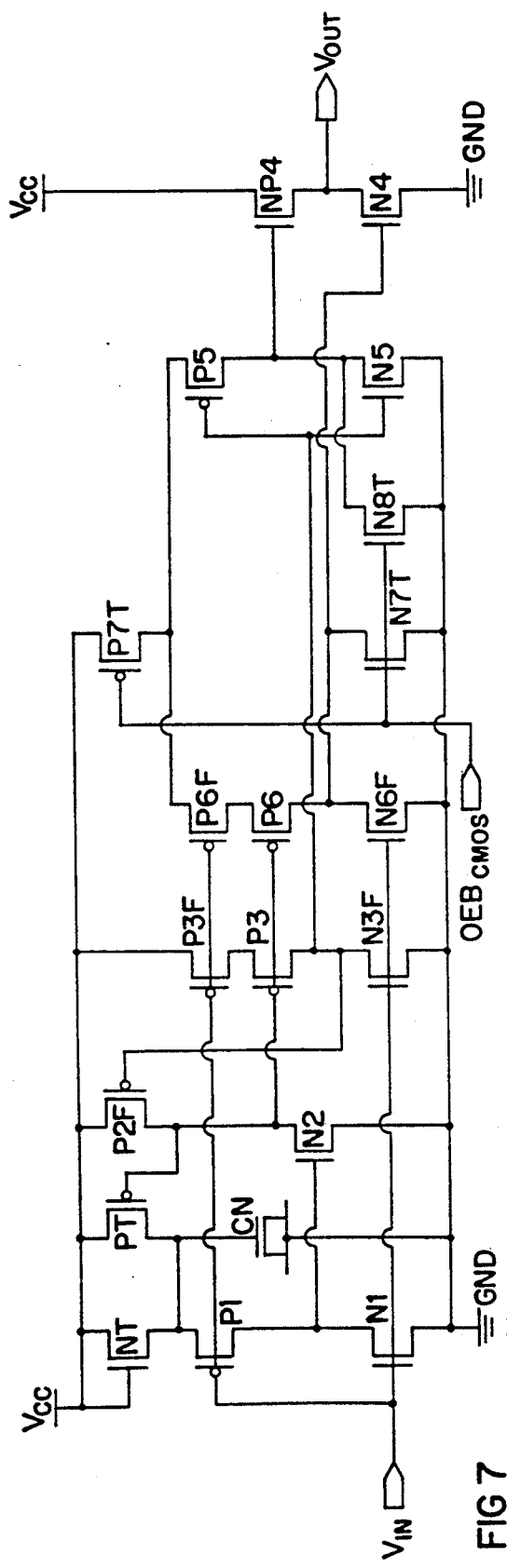
FIG. 7 is a schematic circuit diagram of the four stage buffer circuit of FIG. 6 with the split path output control and further incorporating tristate enable circuit elements.

A final incremental circuit feature added to the split path output buffer circuit of FIG. 6 is shown in FIG. 7 where a tristate enable node $OEB_{CMOS}$ and related tristate transistor elements are incorporated in the circuit. As shown in FIG. 7 the tristate input node is coupled to drive tristate transistor elements P7T, N7T, and N8T which are in turn coupled to disable the split path output stage pullup transistor element NP4 and pulldown transistor element N4. It is also noted that in the example of FIG. 7 NMOS transistor elements are used for both the final pullup and pulldown transistor elements controlling the final CMOS output node $V_{OUT}$. This is possible because the first and second split path nodes and first and second split path output stages perform the phase splitting function for independent split path control of the NMOS pullup and pulldown transistor elements in opposite phases. Example values for the additional MOS transistor element components added to the circuit of FIG. 7 are set forth in Table V.

TABLE V

| (FIG. 7) | |
|---|---|
| MOS TRANSISTOR | CHANNEL WIDTH (μ) |
| P7T | 900 |
| N7T | 100 |
| N8T | 100 |
| NP4 | 1500 |

Figure 8:
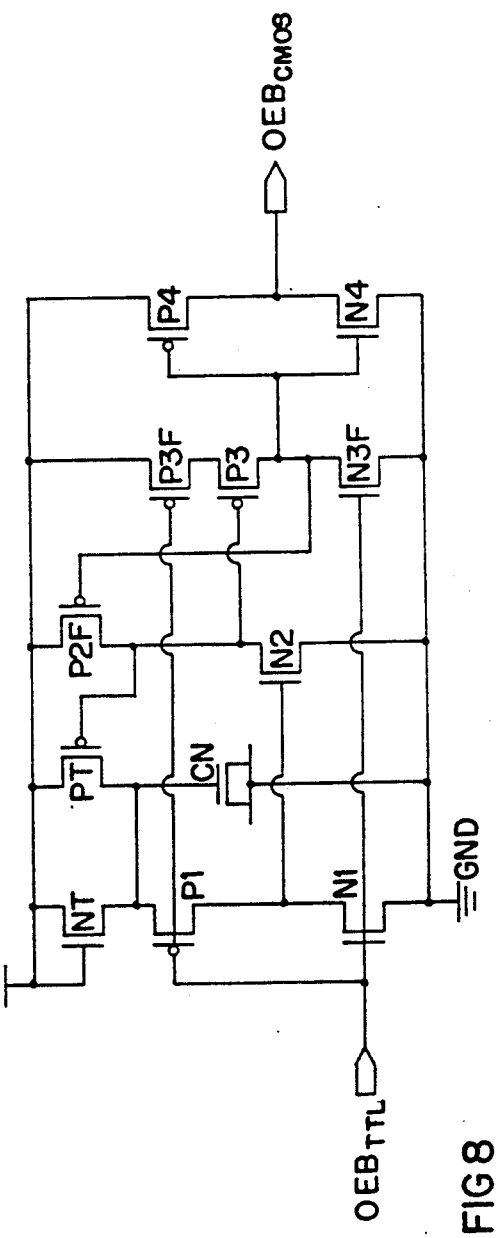
FIG. 8 is a schematic circuit diagram of an output enable gate for generating tristate enable signals without static current $I_{CCt}$.

An output enable gate for generating tristate enable signals for the tristate input node of the buffer circuit of FIG. 7 is shown in FIG. 8. This output enable gate delivers tristate enable or output enable signals with full CMOS voltage signal swing from TTL input signals. It is apparent that this output enable gate of FIG. 8 follows the basic pattern of the TTL to CMOS translating buffer circuit of FIG. 5 arranged to provide output enable signals for the tristate input node. All of the TTL to CMOS translating buffer circuits of FIGS. 2-8 according to the invention incorporate the various features of the invention achieving DC performance with no substantial quiescent or static current $I_{CCt}$, while maintaining or even enhancing data signal propagation speed.

Figure 9:
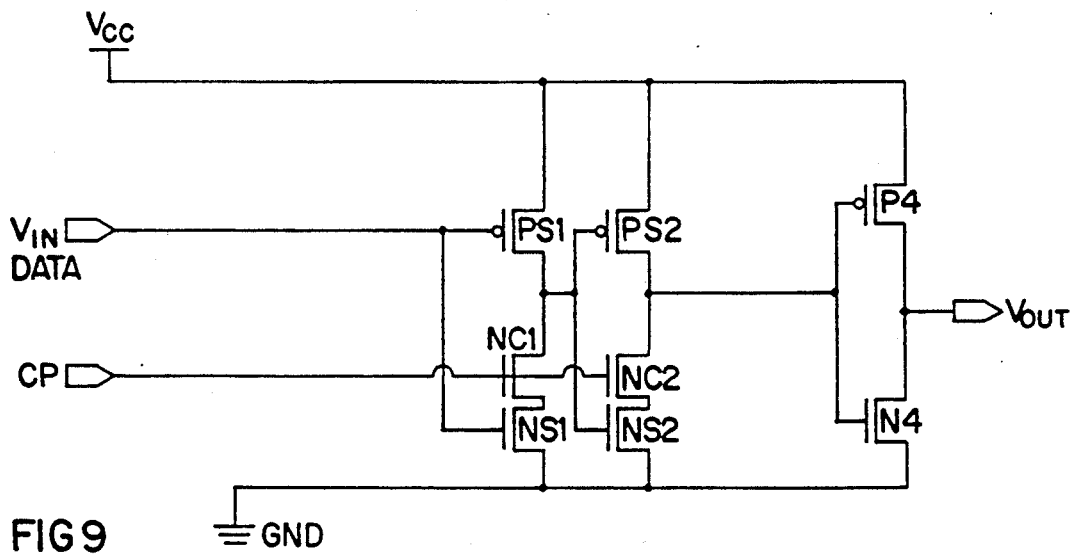
FIG. 9 is a schematic circuit diagram of a simplified latch circuit with divided latch stages according to the invention for dynamic mode latch circuit operation and without static current $I_{CCt}$ in the clock signal portions of the latch circuit.

A basic latch circuit according to the invention for dynamic mode AC switching operation is illustrated in FIG. 9. The basic latch is split into two divided latch stages PS1, NS1 and PS2, NS2. With divided latch stages, the dynamic mode latch can be clocked using NMOS transistors only. Thus, a first NMOS clock transistor element NC1 is coupled in series with the first divided latch stage pulldown transistor element NS1. A second NMOS clock transistor element NC2 is coupled in series with the second divided latch stage pulldown transistor element NS2. The two clock transistor elements NC1 and NC2 are coupled in parallel to the TTL clock input node CP.

With a high potential level clock signal at the TTL clock input node CP, the clock transistor elements are conducting and "transparent" and data signals at the TTL data input $V_{IN}$ propagate through the divided latch stages to the output stage P4, N4 and to the final CMOS output node $V_{OUT}$ during dynamic mode AC operation. With a low potential clock signal at the node CP, the divided latch stages transiently or temporarily latch the present data signal. The data signal passes during dynamic mode LH transition at the clock input node CP. Because the divided latch stages permit clocking the dynamic latch with NMOS transistor elements only, there is no leakage current or static current $I_{CCt}$ due to clock portions of the circuit as would be the case in conventional latch circuits having a clock stage incorporating a PMOS transistor element.

Figure 10:
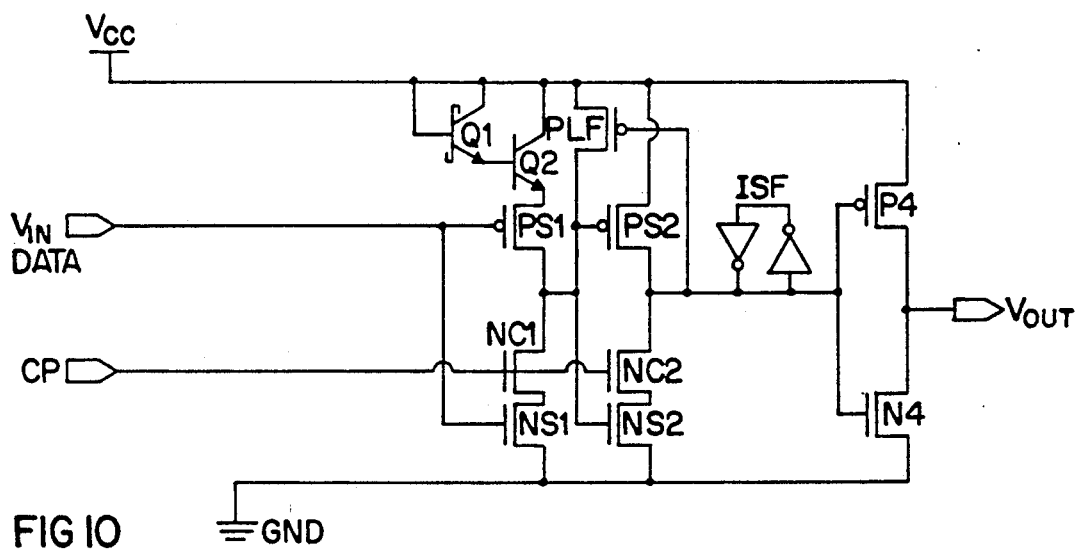
FIG. 10 is a schematic circuit diagram of the latch circuit with divided latch stages and a latch feedback data retention or data saving transistor element for static mode operation of the latch circuit.

For operation of the latch circuit in divided latch stages during static mode operation, a latch feedback transistor element PLF is coupled between the divided latch stages. As shown in FIG. 10 the output node of the first divided latch stage PS1, NC1, NS1 is coupled to the input node of the second divided latch stage PS2, NC2, PS2 at an intermediate node. The PMOS latch feedback transistor element PLF is coupled between this intermediate node and the high potential rail $V_{CC}$. PMOS transistor PLF is driven by the output node of the second divided latch stage. PMOS transistor element PLF provides a "boot strap" for saving or restoring the current data signal phases in the latch at the time of latching caused by a HL transition at the clock input CP.

The latch feedback transistor PLF performs two functions during the static mode operation or DC condition of the latch. The transistor element PLF can pull up the intermediate node to the full CMOS high potential level and turn off the second divided latch stage pullup transistor element PS2 preventing leakage currents in the second divided latch stage PS2, PC2, NS2. At the same time, feedback transistor element PLF sustains the data signal at the output of the second divided latch state PS2, PC2, NS2. Thus latch feedback transistor element PLF acts both as a data saver preventing loss of data at the intermediate node and as a power saver substantially eliminating static current $I_{CCt}$. Example channel width parameters for MOS transistor elements of FIGS. 9 and 10 are set forth in Table VI.

TABLE VI
(FIGS. 9 & 10)

| MOS TRANSISTOR | CHANNEL WIDTH ($\mu$) |
|---|---|
| PS1 | 25 |
| NC1 | 200 |
| NS1 | 100 |
| PLF | 25 |
| PS2 | 400 |
| NC2 | 400 |
| NS2 | 400 |
| P4 | 1600 |
| N4 | 1000 |
| ISF's | 12, 9 |
|  | 12, 6 |

For data retention at the output stage P4, N4 a pair of static mode operation feedback invertors ISF are coupled back to back or cross coupled between the output node of the second divided latch stage PS2, NC2, NS2 and the input node of output stage P4, N4. The cross coupled static feedback invertors ISF store data for the pullup transistor element P4 of the data output stage and during CMOS output node disable as for example implemented by a tristate enable circuit as hereafter described.

Figure 11:
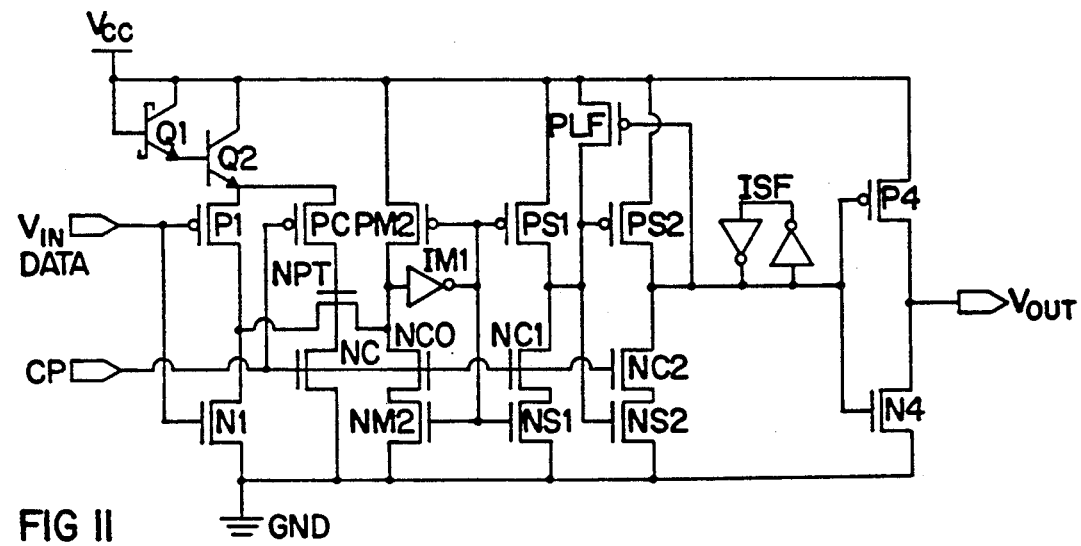
FIG. 11 is a schematic circuit diagram of a TTL to CMOS translating flip-flop circuit according to the invention incorporating the divided latch stages of FIG. 10 as a split slave latch with split slave stages.

The divided or split latch stage static mode operation latch circuit of FIG. 10 is incorporated as a split slave latch in a TTL to CMOS translating flip-flop as illustrated in FIG. 11. As shown in FIG. 11 a master latch including a pair of back-to-back coupled master latch stages is incorporated in the flip-flop circuit between the slave latch and the TTL input node $V_{IN}$. The master latch includes an input master stage or first master stage IM1 and a feedback master stage or second master stage PM2, NM2. A clock transistor element NCO is coupled in only one of the master latch stages, in series with the second master latch stage pulldown transistor element NM2. Second master latch stage clock transistor element NCO is coupled in parallel with the clock transistor elements NC1 and NC2 of the split slave latch stages to the TTL clock input node CP.

The TTL data input node $V_{IN}$ is coupled to the input node of a data input stage P1, N1. The output node of the data input stage P1, N1 is coupled through a pass gate NMOS transistor element NPT to the input node of the master latch. The conducting state of the pass through gate NMOS transistor element NPT is controlled by a clock input gate PC, NC having an input node coupled to the TTL clock input node CP. The output node of clock input gate PC, NC is coupled to the control gate node of pass through gate NPT.

The static current $I_{CCt}$ is substantially eliminated in the TTL to CMOS translating flip-flop circuit of FIG. 11 as follows. The PMOS pullup transistor element P1 of the data input stage and the PMOS pullup transistor element PC of the clock input stage are coupled to a common node. A voltage drop threshold component circuit is coupled between that common node and the high potential rail $V_{CC}$. The threshold component circuit Q1,Q2 provides sufficient voltage drop to turn off the data input stage PMOS pullup transistor element P1 when a TTL high potential level signal appears at the TTL data input node $V_{IN}$. Similarly the threshold component voltage drop is sufficient to cause turn off of the clock input stage PMOS pullup transistor element PC when a TTL high potential level clock signal appears at the TTL clock input node CP. Static current $I_{CCt}$ is therefore substantially eliminated in the data input stage and clock input stage. The remaining clock transistor elements NCO, NC1, NC2 make use of NMOS transistor elements only so that static high current $I_{CCt}$ due to the TTL clock input node CP and clock portions of the circuitry is avoided. In the data circuit, data signals at the input stage pass to the master latch only through the NMOS pass through gate NPT. The output node of the input data stage, P1, N1 therefore does not have to turn off a PMOS transistor element. The PMOS transistor in inverter IM1 is turned off by PM2. Translation from TTL high and low potential levels to CMOS high and low potential levels is therefore completed at the input to the master latch.

With a clock signal low potential at node CP data passes into the master latch input stage IM1. At the same time the split slave latch stages latch and store the data signal currently in the slave latch. With a high potential clock signal at the TTL clock input node CP a new data signal cannot pass to the master latch, and the stored data signal in the slave latch passes to the output of the flipflop. Example values for additional MOS transistor elements appearing in FIG. 11 are set forth in Table VII.

TABLE VII
(FIG. 11)

| MOS TRANSISTOR | CHANNEL WIDTH (μ) |
|---|---|
| P1 | 100 |
| N1 | 50 |
| PC | 50 |
| NC | 50 |
| NPT | 50 |
| IM1 | 15,68 |
| PM2 | 12 |
| NCO | 9 |
| NM2 | 9 |

In the TTL to CMOS translating flip-flop circuit of FIG. 12 the flip-flop circuit is provided with split path output stages and independent split path drive control for the final pullup and pulldown transistor elements. In this example the final pullup and pulldown transistor elements provide a final TTL output node $V_{OUT}$. In order to accomplish this a third split slave latch stage PS3, NC3, NS3 is coupled in parallel with the second split slave stage or divided slave stage PS2, NC2, NS2. The parallel second and third split slave stages provide separate split path output nodes for driving split path output stages as heretofore described. In the circuit of FIG. 12 however the data retention invertors, that is the static mode operation cross coupled feed back invertors ISF, are enhanced with a third data retention stage P6S, N6S in preparation for introducing a tristate enable signal input node $OEB_{CMOS}$ and tristate enable transistor elements P7T, N7T, N8T as illustrated in FIG. 13.

The tristate enable signals of the tristate input node $OEB_{CMOS}$ drive the tristate enable transistor elements P7T, N7T, N8T for disabling the second split path output stage pullup transistor element Q3, Q4, and pulldown transistor element N4 for disabling the output node $V_{OUT}$. This tristate mode circuit arrangement is also described with reference to the buffer circuit of FIG. 7. The third data retention stage P6S, N6S is introduced in order to restore or revive the value of the data signal at the CMOS output node $V_{OUT}$ after power up from the tristate condition Z. In particular the third data retention stage P6S, N6S assures restoration of the data signal upon a tristate to low (ZL) transition. The 200μ channel width PMOS transistor element P6S is able to turn on the final pulldown transistor element N4 quickly to restore a low potential level data signal at the output $V_{OUT}$.

The small size 9μ channel width NMOS transistor element N6S stops leakage current to the pulldown transistor element N4 in the enable mode when the pulldown transistor element N4 off. With a low potential level clock signal, the normal path to ground through clock transistor NC3 from the gate of final pulldown transistor element N4 is off. It is in this condition that the small NMOS transistor element N6S keeps any current from leaking to pulldown transistor element N4 and stops charge buildup at the gate of N4 which might turn it on. Example channel width parameter values for the MOS transistor elements incorporated in the circuits of FIGS. 12 & 13 are found in Table VIII.

TABLE VIII
(FIGS. 12 & 13)

| MOS TRANSISTOR | CHANNEL WIDTH (μ) |
|---|---|
| P1 | 100 |
| N1 | 50 |
| PC | 50 |
| NC | 50 |
| NPT | 50 |
| PM2 | 12 |
| IM1 | 15,68 |
| NCO | 9 |
| NM2 | 9 |
| PS1 | 100 |
| NC1 | 200 |
| NS1 | 400 |
| PLF | 25 |
| PS2 | 200 |
| NC2 | 200 |
| NS2 | 200 |
| PS3 | 400 |
| NC3 | 400 |
| NS3 | 400 |
| ISF's | 12,9 |
|  | 68,15 |
| P6S | 200 |
| N6S | 9 |
| P5 | 300 |
| N5 | 25 |
| N4 | 1000 |
| P7T | 900 |
| N7T | 100 |
| N8T | 100 |

The TTL to CMOS translating latch circuits and flip-flop circuits of the invention illustrated in FIGS. 9-13 thus provide data latching and data retention circuits in a variety of configurations with substantially no static leakage current $I_{CCt}$ through the stages of the circuits.

While the invention has been described with reference to particular example embodiments it is intended to cover all modifications and equivalents within the scope of the following claims.

I claim:

1. A TTL to CMOS translating buffer circuit having a TTL input node with input data signals at TTL high and low potential levels, and at least one CMOS output node with output data signals at CMOS high and low potential levels, said buffer circuit having a plurality of digital logic invertor stages respectively coupled between high and low potential rails, each said stage having a pullup transistor element coupled to the high potential rail, a pulldown transistor element coupled to the low potential rail, at lest one input node, and an output node, comprising:

first, second and third stages each comprising a PMOS pullup transistor element and an NMOS pulldown transistor element, said first, second and third stages comprising digital logic invertor stages;

voltage drop threshold component means coupled between the PMOS pullup transistor element of the first stage and the high potential rail, said threshold component means interposing sufficient voltage drop for substantially turning off the first stage PMOS pullup transistor element with a TTL high potential level signal at the respective first stage input node;

the output node of said first stage being coupled to an input node of the second stage to drive the second stage NMOS pulldown transistor element;

the output node of the second stage being coupled to an input node of the third stage to drive the third stage PMOS pullup transistor element;

and the output node of the third stage being coupled in a feedback coupling to an input node of the second stage to drive the second stage PMOS pullup transistor element for pullup of a control gate node of the second stage PMOS pullup transistor element to the CMOS high potential level for turning off the second stage PMOS pullup transistor element;

said second stage PMOS pullup transistor element causing pullup of the output node of the second stage to the CMOS high potential level for turning off the third stage PMOS pullup transistor element;

said buffer circuit thereby having substantially no static current $I_{CCT}$ through the respective PMOS pullup transistor elements of said first, second and third stages.

2. The buffer circuit of claim 1 wherein the input node of the first stage is also coupled to drive the third stage NMOS pulldown transistor element in a feed forward coupling for reducing data signal propagation delay.

3. The buffer circuit of claim 2 wherein the third stage comprises PMOS first and second pullup transistor elements coupled in series, wherein the output node of the second stage is coupled to drive the third stage first PMOS pullup transistor element, and wherein the input node of the first stage is also coupled to drive the third stage second PMOS pullup transistor element in a feed forward coupling for reducing crowbar current in said third stage.

4. The buffer circuit of claim 1 wherein the transistor elements comprise a primary current path between source and drain nodes and a control gate node, wherein the first stage output node is coupled to the control gate node of the second stage NMOS pulldown transistor element, wherein the output node of the second stage is coupled to the control gate node of the third stage PMOS pullup transistor element, and wherein the output node of the third stage is coupled to the control gate node of the second stage PMOS pullup transistor element in a feedback coupling.

5. The buffer circuit of claim 4 wherein the first stage input node comprises the buffer circuit TTL input node and is coupled to the control gate nodes of the first stage PMOS pullup and NMOS pulldown transistor elements and wherein the first stage input node is also coupled to the control gate node of the third stage NMOS pulldown transistor element in a feed forward coupling for reducing data signal propagation delay.

6. The buffer circuit of claim 5 wherein the third stage comprises PMOS first and second pullup transistor elements having source and drain nodes coupled in series wherein the output node of the second stage is coupled to the control gate node of the third stage first pullup transistor element and wherein the buffer circuit TTL input node is also coupled to the control gate node of the third stage second pullup transistor element in a feed forward coupling for reducing crowbar current said third stage.

7. The buffer circuit of claim 2 further comprising a low impedance transient current source circuit including a capacitor coupled to the source node of the first stage pullup transistor element for providing transient current upon turn on of the first stage pullup transistor element, and a charging feedback transistor element having source and drain nodes coupled between said capacitor and high potential and a control gate node coupled to the second stage output node for recharging said capacitor.

8. The buffer circuit of claim 7 wherein the threshold component means comprises bipolar transistor elements coupled in diode configuration in a diode stack.

9. The buffer circuit of claim 6 comprising a fourth stage coupled in parallel with the third stage said fourth stage comprising PMOS first and second pullup transistor elements coupled in series and an NMOS pulldown transistor element, the output nodes of the respective third and fourth stages providing first and second split path nodes for driving split path output stages.

10. The buffer circuit of claim 9 comprising an output stage having first and second split path output stages, each split path output stage having pullup and pulldown transistor elements, said first split path output stage having an input node coupled to the first split path node from the third stage and an output node coupled to drive the second split path output stage pullup transistor element, said second split path node of the fourth stage being coupled to drive the second split path output stage pulldown transistor element, said second split path output stage having an output node providing a buffer circuit CMOS output node, said second split path output stage pullup and pulldown transistor elements providing CMOS output node pullup and pulldown transistor elements, thereby providing independent split path drive control of the CMOS output pullup and pulldown transistor elements 11. The buffer circuit of claim 10 further comprising a tristate enable signal input node and tristate enable transistor elements operatively coupled for disabling the CMOS output node pullup and pulldown transistor elements in a tristate mode response to a tristate enable signal.

12. The buffer circuit of claim 10 wherein the second split path output stage pullup transistor element providing the CMOS output node pullup transistor element comprises a pair of bipolar transistor elements coupled in a Darlington configuration.

13. The buffer circuit of claim 10 wherein the second split path output stage pullup transistor element providing the CMOS output node pullup transistor element comprises an NMOS pullup transistor element, said first and second split path nodes and said first and second split path output stages providing phase splitting means for controlling the CMOS output node NMOS pullup transistor element out of phase with the respective NMOS pulldown transistor element.

14. A TTL to CMOS translating data latch circuit having a TTL input node with input data signals at TTL high and low potential levels, and at least one CMOS output node with output data signals of CMOS high and low potential levels, said latch circuit having MOS invertor stages respectively coupled between high and low potential rails, each said stage having a pullup transistor element coupled to the high potential rail, pulldown transistor element coupled to the low potential rail, an input node and an output node, said latch circuit comprising:

divided latch stages comprising a first latch stage having an input node coupled to the latch circuit TTL input node;

said divided latch stages also including a second latch stage having an input node coupled to the first latch stage output node at an intermediate node;

at least one output stage having an output node coupled to the latch circuit CMOS output node, an output node of the second latch stage being coupled to drive the output stage;
a first NMOS clock transistor element coupled in series with the first latch stage pulldown transistor element;
a second NMOS clock transistor element coupled in series with the second latch stage pulldown transistor element;
a single phase TTL clock pulse node having clock pulse signals of TTL high and low potential levels coupled to drive the first and second clock transistor elements in a feed forward parallel coupling for clocking the divided latch stages at the same time with a single phase clock signal;
said clock transistor elements thereby having no substantial static current $I_{CCt}$ in the latch mode during dynamic mode latch operation.

15. The latch circuit of claim 14 further comprising a PMOS latch feedback transistor element (PLF) coupled between said intermediate node and the high potential rail, the output node of the second latch stage being coupled to drive said PLF in a feedback coupling for retaining data signals in the latch node during static mode operation of the latch circuit, said PLF also comprising means to pullup the intermediate node to the CMOS high potential level for no substantial static current $I_{CCt}$ through the second latch stage.

16. The latch circuit of claim 15 further comprising a pair of static feedback cross coupled invertors (ISF) coupled between the output node of the second latch stage and the output stage for retaining data signals in the latch mode during static mode operation of latch circuit.

17. The latch circuit of claim 15 wherein the divided stages each comprise a PMOS pullup transistor element and further comprising voltage drop threshold component means coupled between the PMOS pullup transistor element of the first latch stage and the high potential rail, said threshold component means interposing sufficient voltage drop for turning off the first stage PMOS pullup transistor element with a TTL high potential level signal at the respective first stage input node, said latch circuit thereby having no substantial static current $I_{CCt}$ through either the first or second latch stages.

18. A TTL to CMOS translating latch circuit having a TTL input node with input data signals at TTL high and low potential levels, a CMOS output node with output data signals at CMOS high and low potential levels, said latch circuit having MOS invertor stages coupled between high and low potential power rails, each invertor stage having a pullup transistor element coupled to the high potential rail, pulldown transistor element coupled to the low potential rail, an output node, and an input node, said latch circuit comprising:
divided latch stages comprising a first slave stage having an input node coupled to the latch circuit TTL input node;
said divided latch stages also including a second slave stage having an input node coupled to the first slave stage output node at an intermediate node;
and a data retention slave latch feedback transistor element (PLF) coupled between said intermediate node and the high potential rail, the output node of the second slave stage being coupled to drive the PLF for retaining data signals in the latch mode during static mode operation of the latch circuit.

19. The latch circuit of claim 18 further comprising an output stage and a pair of static feedback cross coupled invertors operatively coupled between the output node of the second slave stage and the input node of the output stage for further retention of data signals during static mode operation of the latch circuit.

20. The latch circuit of claim 18 wherein the divided latch stages comprise PMOS pullup transistor elements and further comprising voltage drop threshold component means coupled between the PMOS pullup transistor element of the first slave stage and the high potential rail, said threshold component means interposing sufficient voltage drop for turning off the first stage PMOS pullup transistor element with a TTL high potential level signal at the respective first slave stage input node;
said PLF comprising means to pullup said intermediate node to the CMOS high potential level for turning off the PMOS transistor element of the second slave stage;
said latch circuit thereby having no substantial static current $I_{CCt}$ through either said first or second slave stages.

21. The latch circuit of claim 20 further comprising:
a first NMOS clock transistor element coupled in series with the first slave stage pulldown transistor element;
a second NMOS clock transistor element coupled in series with the second slave stage pulldown transistor element;
a single phase TTL clock pulse node having clock pulse signals of TTL high and low potential levels coupled to drive the first and second clock transistor elements in a feed forward parallel coupling for clocking the divided latch stages at the same time with a single phase clock signal;
said clock transistor elements thereby having no substantial static current $I_{CCt}$ during operation in the latch mode.

22. The latch circuit of claim 21 comprising:
master latch cross coupled invertor stages operatively coupled between the latch circuit TTL input node and the input node of the first slave stage;
a pass through gate operatively coupled between the latch circuit TTL input node and the master latch cross coupled invertor stages, and pass through gate control circuit means coupled to the clock pulse node and pass through gate for operating the pass through gate out of phase with the clock transistor elements of the first and second slave stages.

23. The latch circuit of claim 22 further comprising:
a data input stage operatively coupled between the latch circuit TTL input node and said pass through gate;
and a clock input stage operatively coupled between the TTL single phase clock pulse node and said pass through gate for controlling the conducting state of the pass through gate out of phase with the clock pulse transistor elements of the first and second slave stages.

24. The latch circuit of claim 23 wherein the data input stage and clock input stage comprise PMOS pullup transistor elements coupled to a common node and further comprising voltage drop threshold component means coupled between said common node and the high potential rail, said threshold component means interposing sufficient voltage drop for turning off the data input stage PMOS pullup transistor element with a TTL high potential level signal at the latch circuit TTL input node, and for turning off the clock input stage PMOS pullup transistor element with a TTL high potential level signal at the single phase clock pulse node, said latch circuit thereby having no substantial static current $I_{CCt}$ through any of the stages of the latch circuit.

25. The latch circuit of claim 24 wherein the threshold component means comprises a plurality of bipolar transistor elements coupled in diode configuration in a diode stack.

26. The latch circuit of claim 24 wherein the threshold component means comprises an NMOS transistor elements coupled in diode configuration.

27. The latch circuit of claim 24 an output stage and a pair of data retention static feedback cross coupled invertor stages operatively coupled between an output node of the second slave stage and an input node of the output stage for further data retention during static mode operation of the latch circuit.

28. The latch circuit of claim 27 wherein the output stage comprises first and second split path output stages having pullup and pulldown transistor elements said first split path output stage having an output node coupled to drive the second split path output stage pullup transistor element, said second slave stage being coupled to drive the first split path output stage and second split path output stage pulldown transistor element in a feed forward coupling, said second split path output stage providing the latch circuit CMOS output node with separate split path drive control of the CMOS output node pullup and pulldown transistor elements.

29. The latch circuit of claim 28 wherein the pullup transistor element of the second split path output stage comprises a Darlington transistor pair of bipolar transistor elements.

30. The latch circuit of claim 21 comprising:
a master latch having master latch cross coupled invertor stages with an output node coupled to the input node of the first slave stage;
a pass through gate operatively coupled to an input node of the master latch;
a data input stage operatively coupled between the pass through gate and the latch circuit TTL data input;
a clock input gate operatively coupled between the single phase TTL clock pulse node and the pass through gate for controlling operation of the pass through gate out of phase with the clock transistor elements of the first and second slave stages;
said data input stage and clock input stage comprising PMOS pullup transistor elements coupled to a common node;
and voltage drop threshold component means coupled between said common node and the high potential rail, said threshold component means interposing sufficient voltage drop for turning off the first stage PMOS pullup transistor element with a TTL high potential level signal at the latch circuit TTL data input node, and for turning off the clock input stage PMOS pullup transistor element with a TTL high potential level signal at the single phase clock input node;
said latch circuit thereby having no substantial static current $I_{CCt}$ through the respective stages of the latch circuit.

31. The latch circuit of claim 30 wherein the pass through gate comprises an NMOS transistor element having a control gate node coupled to an output node of the clock input gate, said pass through gate NMOS transistor element operatively coupled between an output node of the data input stage and an input node of the master latch.

32. The latch circuit of claim 31 comprising:
an output stage having an input node coupled to an output node of the second slave stage;
and a pair of data retention static feedback cross coupled invertors for further data retention during static mode operation of the latch circuit.

33. The latch circuit of claim 32 comprising:
a third slave stage coupled in parallel with the second slave stage said third slave stage comprising a third NMOS clock transistor element operatively coupled in series with the third slave stage pulldown transistor element, said third clock transistor element being coupled in the feed forward coupling to the single phase TTL clock pulse node, the output nodes of the respective second and third slave stages providing respective first and second split path nodes for driving split path output stages;
and wherein said output stage comprises first and second split path output stages having pullup and pulldown transistor elements, said first split path output stage having an input node coupled to the first split path node and an output node coupled to drive the second split path output stage pullup transistor element, said second split path node being coupled to drive the second split path output stage pulldown transistor element, said second split path output stage providing the latch circuit CMOS output node for separate split path drive control of the CMOS output node pullup and pulldown transistor elements.

34. The latch circuit of claim 33 further comprising a tristate output enable node and tristate enable transistor elements operatively coupled to pullup and pulldown transistor elements of the output stage for implementing a tristate mode at the latch circuit CMOS output node;
and wherein the pair of static feedback cross coupled invertor stages coupled between the slave stages and the output stage for data retention in the latch mode during static mode operation of the latch circuit further comprises a third data retention stage coupled between said static feedback cross coupled invertor stages and further having an output node coupled to the CMOS output node pulldown transistor element to prevent leaking of current to said pulldown transistor element during tristate mode.

35. The latch circuit of claim 34 wherein the third data retention stage is skewed to provide a relatively small channel width NMOS pulldown transistor element.

36. A TTL to CMOS translating flip-flop circuit having a TTL input node with input data signals at TTL high and low potential levels, a CMOS output node with output data signals at CMOS high and low potential levels, said flip flop circuit having MOS invertor stages coupled between high and low potential power rails, each invertor stage having a pullup transistor element coupled to the high potential rail, pulldown transistor element coupled to the low potential rail, an output node, and an input node, said flip-flop circuit comprising:
a slave latch having divided slave latch stages comprising a first slave stage having an input node coupled to the flip-flop circuit TTL input node;

said divided slave latch stages also including a second slave stage having an input node coupled to the first slave stage output node at an intermediate node;

a data retention slave latch feedback transistor element (PLF) coupled between said intermediate node and the high potential rail for retaining data signals in the latch mode during static mode operation of the flip-flop circuit;

a first NMOS clock transistor element coupled in series with the first slave stage pulldown transistor element;

a second NMOS clock transistor element coupled in series with the second slave stage pulldown transistor element;

a single phase TTL clock pulse node having clock pulse signals of TTL high and low potential levels coupled to drive the first and second clock transistor elements in a feed forward parallel coupling for clocking the divided latch stages at the same time with a single phase clock signal;

said clock transistor elements thereby having no substantial static current $I_{CCt}$ during operation in the latch mode;

a master latch having master latch cross coupled invertor stages with an output node coupled to the input node of the first slave stage;

a pass through gate operatively coupled to an input node of the master latch;

a data input stage operatively coupled between the pass through gate and the flip-flop circuit TTL input node;

a clock input gate operatively coupled between the single phase TTL clock pulse node and the pass through gate for controlling operation of the pass through gate out of phase with the clock transistor elements of the first and second slave stages;

said data input stage and clock input stage comprising PMOS pullup transistor elements coupled to a common node;

and voltage drop threshold component means coupled between said common node and the high potential rail, said threshold component means interposing sufficient voltage drop for turning off the data input stage PMOS pullup transistor element with a TTL high potential level signal at the flip-flop circuit TTL data input node, and for turning off the clock input stage PMOS pullup transistor element with a TTL high potential level signal at the single phase TTL clock input node;

said flip-flop circuit thereby having no substantial static current $I_{CCt}$ through the respective stages of the flip-flop circuit.

37. The flip-flop circuit of claim 36 wherein the pass through gate comprises an NMOS transistor element having a control gate node coupled to an output node of the clock input gate, said pass through gate NMOS transistor element operatively coupled between an output node of the data input stage and an input node of the master latch.

38. The flip-flop circuit of claim 37 comprising:

a third slave stage coupled in parallel with the second slave stage said third slave stage comprising a third NMOS clock transistor element operatively coupled in series with the third slave stage pulldown transistor element, said third clock transistor element being coupled in the feed forward coupling to the single phase TTL clock pulse node, the output nodes of the respective second and third slave stages providing respective first and second split path nodes for driving split path output stages;

and an output stage comprising first and second split path output stages having pullup and pulldown transistor elements, said first split path output stage having an input node coupled to the first split path node and an output node coupled to drive the second split path output stage pullup transistor element, said second split path node being coupled to drive the second split path output stage pulldown transistor element, said second split path output stage providing the flip-flop circuit CMOS output node for separate split path drive control of CMOS output node pullup and pulldown transistor elements.

39. A TTL to CMOS translating flip-flop circuit having a TTL input node with input data signals at TTL high and low potential levels, a CMOS output node with output data signals at CMOS high and low potential levels, said latch circuit having MOS invertor stages coupled between high and low potential power rails, each invertor stage having a pullup transistor element coupled to the high potential rail, pulldown transistor element coupled to the low potential rail, an output node, and an input node, said latch circuit comprising:

a slave latch with divided slave latch stages comprising a first slave stage having an input node coupled to the flip-flop circuit TTL input node;

said divided slave latch stages also including a second slave stage having an input node coupled to the first slave stage output node at an intermediate node;

a data retention slave latch feedback transistor element (PLF) coupled between said intermediate node and the high potential rail, the output node of the second slave stage being coupled to drive the PLF for retaining data signals in the latch mode during static mode operation of the flip-flop circuit;

a master latch having master latch cross coupled invertor stages with an output node coupled to the input node of the first slave stage;

a pass through gate operatively coupled to an input node of the master latch;

a data input stage operatively coupled between the pass through gate and the flip-flop circuit TTL data input;

a pass through gate control circuit for controlling operation of the pass through gate and master latch out of phase with the slave latch;

said data input stage comprising a PMOS pullup transistor element;

and voltage drop threshold component means coupled between said data input stage PMOS pullup transistor element and the high potential rail, said threshold component means interposing sufficient voltage drop for turning off the first stage PMOS pullup transistor element with a TTL high potential level signal at the flip-flop circuit TTL data input node;

said flip-flop circuit having no substantial static current $I_{CCt}$ through the respective stages of the flip-flop circuit.

40. The flip-flop circuit of claim 39 wherein the pass through gate is an NMOS transistor element coupled between an output node of the data input stage and an input node of the master latch.

* * * * *